United States Patent [19]

Stoverock

[11] Patent Number: 4,495,547
[45] Date of Patent: Jan. 22, 1985

[54] BUSHING FOR USE BETWEEN A CONTROL KNOB AND A HOUSING

[75] Inventor: Paul H. Stoverock, Hannibal, Mo.
[73] Assignee: Harris Corporation, Melbourne, Fla.
[21] Appl. No.: 365,917
[22] Filed: Apr. 6, 1982
[51] Int. Cl.³ ............................................. H01F 15/02
[52] U.S. Cl. .................................... 361/400; 74/548; 338/197
[58] Field of Search ............... 338/166, 162, 184, 202; 308/241, 197, 315, DIG. 7; 174/152 R, 151, 152 G, 110.6; 361/399, 400, 422, 331, 298, 296; 384/439, 300, 280, 297, 278, 296, 420; 200/296; 74/503, 504, 548, 553

[56] References Cited

U.S. PATENT DOCUMENTS

| | | | |
|---|---|---|---|
| 1,694,384 | 12/1928 | Herman | 361/296 |
| 1,810,985 | 6/1931 | Reichenbach | 361/296 |
| 2,154,537 | 4/1939 | Stenberg | 287/53 |
| 2,781,436 | 2/1957 | Barden | 338/162 |
| 3,115,373 | 12/1963 | Alexander | 384/439 |
| 3,503,586 | 3/1970 | Bordes | 251/266 |
| 3,572,284 | 3/1971 | Rattan | 116/124 |
| 3,999,874 | 12/1976 | George et al. | 338/162 |
| 4,037,490 | 7/1977 | Wilson | 74/553 |

FOREIGN PATENT DOCUMENTS 641917 2/1949 United Kingdom ............ 174/110.6

Primary Examiner—A. D. Pellinen
Assistant Examiner—Gregory D. Thompson
Attorney, Agent, or Firm—Yount & Tarolli

[57] ABSTRACT

A bushing is disclosed for protecting a printed circuit board mounted potentiometer or the like from transverse and axial loads which are applied to the potentiometer during adjustment thereof. The potentiometer or other control device has a control shaft which protrudes through a panel opening and which has a knob mounted on the distal end thereof. The bushing fits over the control shaft between the panel and the knob such that axial and radial forces applied to the knob are transmitted to the panel by the bushing. These forces are therefore absorbed by the panel rather than the attachments between the printed circuit board and the potentiometer.

8 Claims, 4 Drawing Figures

BUSHING FOR USE BETWEEN A CONTROL KNOB AND A HOUSING

BACKGROUND AND FIELD OF THE INVENTION

The present invention relates to method and apparatus for preventing forces applied to a control shaft from dislodging the associated control device (e.g., a potentiometer) from a printed circuit board.

Electronic instruments often include potentiometers, variable capacitors, variable inductors, etc. having control shafts which extend through a front panel of the instrument so that their position can be controlled by the instrument user. Most often, the potentiometer for other variable control devices is fixedly mounted to the front panel, and includes wires connecting it to the circuit of which it forms a part. This adds to the cost of assembly of the instrument with which the control device is associated, since the potentiometer or other control device must be manually inserted through the front panel of the instrument, and then attached thereto. Further labor is required in connecting the wires between the control device and the printed circuit (PC) board upon which the other electronic components are mounted.

It has become increasingly popular to mount as many components as possible on a single printed circuit board, since the insertion and soldering of components to printed circuit boards can be automated to a substantial extent. When a potentiometer or other control device is directly mounted on the PC board, however, the radial and axial forces applied to the shaft by the user during manual adjustment of the potentiometer can cause it to become disattached from the printed circuit board. It is therefore desirable that radial and axial loading on a control shaft of a PC board-mounted control device be minimized.

SUMMARY OF THE INVENTION

It is an object of the present invention to provide method and apparatus for reducing radial and axial loading on the control shaft of a PC board mounted control device, such as a potentiometer.

It is an additional object of the present invention to provide such method and apparatus which can be readily applied to existing potentiometers and other control devices, rather than requiring design changes thereto.

In accordance with the present invention, apparatus is disclosed which is adapted for use in a system wherein a device, such as a potentiometer, has a movable control arm and is mounted on a printed circuit board adjacent to a panel so that the control arm extends through an opening in the panel, and where a knob is mounted on the distal portion of the arm. The apparatus comprising a bushing which is adapted to be mounted on the control arm between the housing and the knob. The bushing has a barrel portion and a flange portion, through both of which extends a passage for closely receiving the control arm. The barrel portion is dimensioned to fit in the panel opening and to be closely received thereby. The flange portion is attached to one end of the barrel portion and has a dimension larger than the opening in the panel. The bushing can therefore be mounted on the control arm between the panel and the knob, with one axial face of the flange portion abutting the panel and the other axial face of the flange portion abutting the knob so that both axial and transvere loading applied to the knob are absorbed by the bushing and the panel, rather than being transmitted to the printed circuit board via the control arm.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

Figure 1:
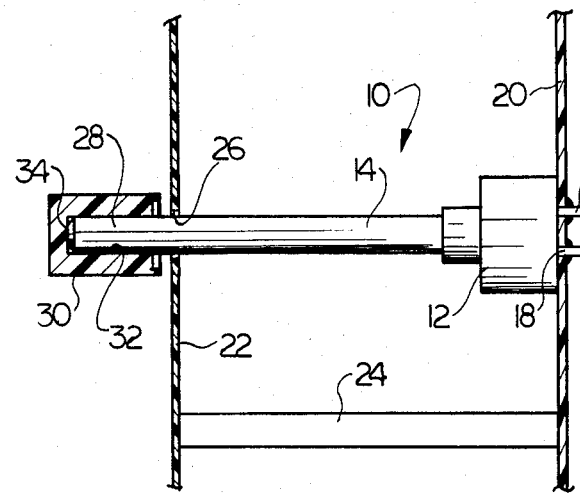
FIG. 1 is an elevation view, partly in section, showing the manner in which potentiometers and other control devices have been mounted in the past.

FIG. 1 is a drawing showing the manner in which potentiometers and the like have been mounted on printed circuit (PC) boards in the past. As shown in FIG. 1, potentiometer 10 includes a body portion 12 within which the resistive material and the wiper arm are contained, a control shaft 14 for controlling the position of the wiper arm along the resistive material, and electrical connection pins 16 and 18 extending from the body portion 12. The body portion 12 of the potentiometer is mounted on a printed circuit board 20 such that the rear face thereof is essentially flush against the printed circuit board. The terminals 16 and 18 extend through the printed circuit board. The foil printed circuit leads are formed on the surface of printed circuit board 20 opposite of that against which the rear face of the potentiometer 10 abuts. The terminals 16 and 18 are electrically connected to corresponding foil conductors on the PC board by conventional wave soldering techniques and the like.

The printed circuit board 20 is held in a fixed, substantially parallel relationship with a front panel 22 by standoffs 24, only one of which is shown in FIG. 1, such that the potentiometer faces the front panel. The control shaft 14 protrudes through an opening 26 in front panel 22. The portion 28 of control shaft 14 extending beyond the front panel 22 is received by a control knob 30 having a correspondingly sized bore 32 therein. The bore 32 will normally be slightly smaller than the size of the control shaft, whereby it can be press-fit into place. Alternatively the knob may include a set screw for fastening the knob to the shaft.

When the knob 30 is inserted over the control shaft 14, the distal end 34 of the control shaft 14 will normally come into contact with the bottom of the bore 32 before the rearward face of the control knob 30 abuts against the front panel 22. The knob 30 will therefore be held in a spaced relationship to the front panel 22 by the control shaft 14. This spacing is established by appropriate selection of the length of either standoff 24 or control shaft 14.

In the device of FIG. 1 both radial and axial forces applied to the control knob 30 will be transmitted to the potentiometer 10, and more particularly to the connection between the terminals 16 and 18 and the printed circuit board 20. When an axial force is applied to the knob 30, for example, this force will be directly transmitted to the terminals 16 and 18 of the potentiometer 10, since there is no intervening structure to absorb that force. Similarly, since the shaft 14 has a somewhat smaller outside diameter than the inside diameter of the opening 26 in the front panel 22 through which it fits, radial forces applied to the control knob will also be directly transmitted to the terminals 16 and 18. This can damage either the connections between the terminals 16 and 18 and the printed circuit board, or the foil patterns on the printed circuit board, itself.

Figure 2:
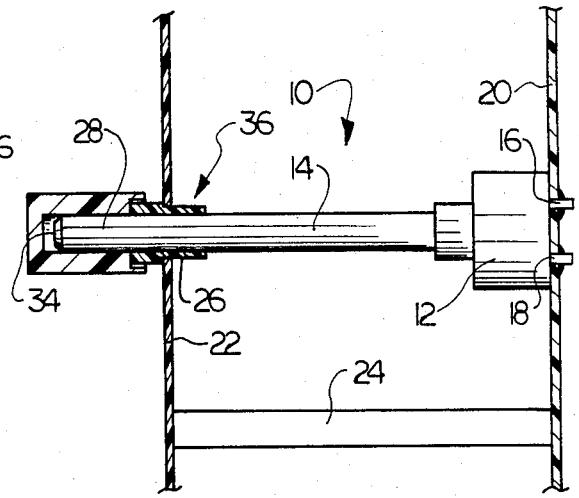
FIG. 2 is an elevation view of the device of FIG. 1, but modified in accordance with the teachings of the present invention.
Figure 3:
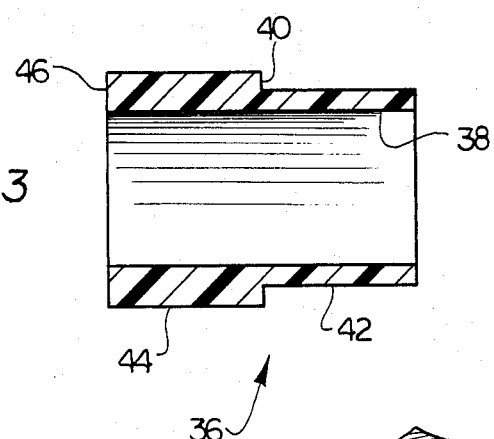
FIG. 3 is a sectional view of the bushing used to reduce radial and axial loadings on the control shaft of the control device.
Figure 4:
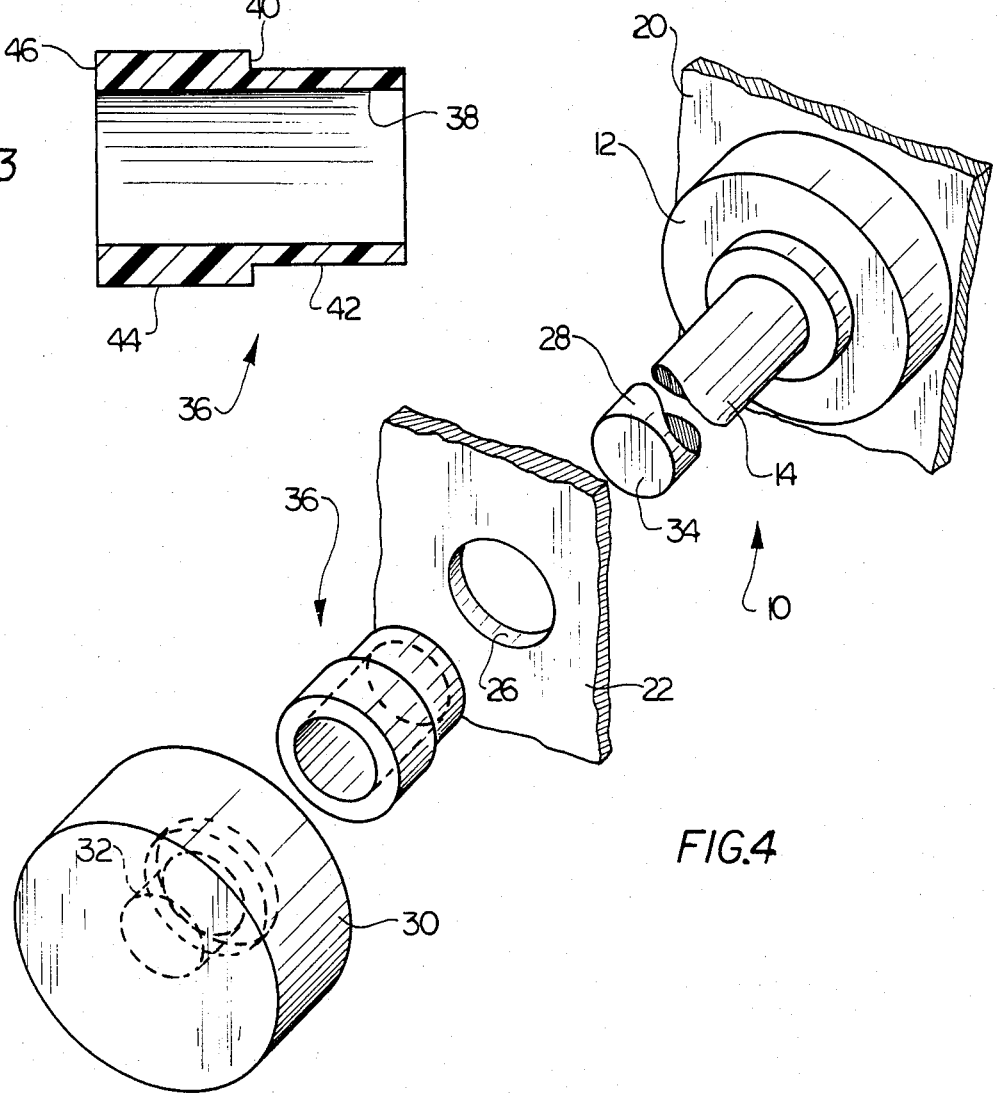
FIG. 4 is an exploded isometric view of the control device of FIG. 2, showing the individual elements thereof in a disassembled state.

In accordance with the present invention, a bushing is assembled onto the control shaft 14 so as to absorb radial and axial forces applied by the control knob 30, thereby reducing the danger of damage to the electrical connections between the potentiometer or other control device and the PC board to which it is attached. This bushing is shown in FIGS. 2, 3 and 4, wherein elements similar to corresponding elements in FIG. 1 are denoted by similar reference numerals.

As can be seen in these Figures, the bushing 36 is largely cylindrical in shape, having an cylindrical central passage 38 dimensioned to closely receive the control shaft 14. The outer diameter of the bushing 36 is stepped so as to produce a flange 40 therein. This flange defines a boundary between a barrel portion 42 having a first outside diameter adapted to closely match the inner diameter of the opening 26 in the front panel 22, and a flange portion 44 having a somewhat greater outside diameter such that this portion is unable to pass through the opening 26 in the front panel 22.

During assembly, the bushing 36 is inserted over the control shaft 14 such that its barrel portion 42 is received by the opening 26 in the front panel 22. The flange 40 in the bushing 36 will abut the front panel 22. The knob 30 is then press-fit onto the control shaft 14. The back surface of the control knob 30 will strike the axial end 46 of the flange portion 44 before the distal end 34 of the control shaft 14 reaches the bottom of the bore 32 within the control knob 30. Because of this, axial forces applied to the knob 30 will be transmitted to the front panel 22 by the bushing 36, rather than being transmitted to the connections between the potentiometer 10 and the printed circuit board 20. Similarly, since the barrel portion 42 of the bushing 36 is dimensioned to be closely received by the opening 26 of the front panel 22, radial forces applied to the control knob 30 will similarly be absorbed by the front panel 22 rather than by the interconnections between the potentiometer 10 and the printed circuit board 20.

The bushing 36 will preferably be constructed of Teflon or other similar material such that frictional resistance to the rotation of the knob 30 and shaft 14 is minimized.

Although the invention has been described with respect to a preferred embodiment, it will be appreciated that various rearrangements and alterations of parts may be made without departing from the spirit and scope of the present invention, as defined in the appended claims.

What is claimed is:

1. In a system including a device having a movable control arm, a printed circuit board, and a panel disposed adjacent said board, said device being mounted on said printed circuit board so that the control arm extends through an opening in said panel, and wherein a knob is mounted on the distal portion of said arm, the improvement comprising a bushing having a barrel portion and a flange portion through both of which extends a passage for closely receiving said control arm, where said barrel portion is dimensioned to fit in said panel opening and to be closely received thereby and where said flange portion is attached to one end of said barrel portion and has a transverse dimension larger than said opening, said bushing being mounted on said control arm between said panel and said knob, and where said knob is axially slideable toward said printed circuit board along said arm whereby, when an axial force is applied to said knob, said knob slides to a position wherein one axial face of said flange portion abuts said panel and the other axial face of said flange portion abuts said knob so that both axial and transverse loading applied to said knob are absorbed by said bushing and said panel rather than being transmitted to said printed circuit board via said control arm.

2. Apparatus as set forth in claim 1, wherein said bushing is formed of a low friction material.

3. Apparatus as set forth in claim 2, wherein said low friction material is polytetrafluoroethylene.

4. Apparatus as set forth in claim 1, wherein said control arm is rotatable and has a circular cross section, and wherein said passage through which said control arm is to pass is also circular in cross section.

5. In a system comprising:
a printed circuit board;
a device mounted on said printed circuit board, said device including electric terminals soldered to corresponding foil leads on said printed circuit board;
said device including a control arm;
a control panel having an opening therein for receiving said control arm;
means for mounting said printed circuit board with respect to said control panel such that said control arm extends through said control panel opening; and,
a knob mounted on the distal end of said control arm;
the improvement wherein a bushing is mounted on said control arm between said knob and said control panel and where said knob is axially slideable toward said printed circuit board along said arm into abutment with said bushing, such that said bushing transmits axial and transverse loads to said front panel from said knob, whereby forces on said soldered electric terminals are reduced.

6. Apparatus as set forth in claim 5, wherein said bushing has a barrel portion and a flange portion, said barrel portion being dimensioned to fit in said panel opening and to be closely received thereby, said flange portion being attached to one end of said barrel portion and having a transverse dimension larger than said opening, and said bushing including a passage extending completely through both said portions for closely receiving said control arm, whereby said bushing can be mounted on said control arm between said panel and said knob, with one axial face of said flange portion abutting said panel and the other axial face of said flange portion abutting said knob so that forces applied to said knob are transmitted to said panel by said bushing.

7. Apparatus as set forth in claim 5, wherein said control arm is rotatable, said panel opening is circular, and said barrel portion has closely matching circular cross section.

8. Apparatus as set forth in claim 5, wherein said device is a potentiometer.

* * * * *